United States Patent
Niino et al.

(10) Patent No.: US 9,899,995 B2
(45) Date of Patent: Feb. 20, 2018

(54) SIGNAL MONITORING CIRCUIT AND SIGNAL MONITORING METHOD USING THE SAME

(71) Applicant: Kabushiki Kaisha Toshiba, Minato-ku, Tokyo (JP)

(72) Inventors: Shinsuke Niino, Yokohama Kanagawa (JP); Atsushi Asai, Fujisawa Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/257,175

(22) Filed: Sep. 6, 2016

(65) Prior Publication Data
US 2017/0264278 A1    Sep. 14, 2017

Related U.S. Application Data

(60) Provisional application No. 62/305,990, filed on Mar. 9, 2016.

(51) Int. Cl.
*H03K 5/153* (2006.01)
*H03K 5/24* (2006.01)

(52) U.S. Cl.
CPC ..................... *H03K 5/24* (2013.01)

(58) Field of Classification Search
CPC ........................................................ H03K 5/24
See application file for complete search history.

(56) References Cited

U.S. PATENT DOCUMENTS 5,784,245 A * 7/1998 Moraghan ............ H01H 47/002
361/152

FOREIGN PATENT DOCUMENTS

| JP | 58-151824 A | 9/1983 |
| JP | 10-229631 A | 8/1998 |
| JP | 2003-233425 A | 8/2003 |

* cited by examiner

*Primary Examiner* — Daniel Puentes
(74) *Attorney, Agent, or Firm* — White & Case LLP

(57) ABSTRACT

According to one embodiment, a signal monitoring circuit includes a first comparator circuit that compares an input signal with a first reference value to output a first output signal, a second comparator circuit that compares the input signal with a second reference value different from the first reference value to output a second output signal, a delay time detecting circuit that detects a time difference between times at which the first and second output signals are output, and a threshold-value comparator circuit that compares the detected time difference with a predetermined threshold value to output the comparison result.

18 Claims, 9 Drawing Sheets

SIGNAL MONITORING CIRCUIT AND SIGNAL MONITORING METHOD USING THE SAME

CROSS-REFERENCE TO RELATED APPLICATIONS

This application is based upon and claims the benefit of priority from U.S. Provisional Application No. 62/305,990, filed on Mar. 9, 2016; the entire contents of which are incorporated herein by reference.

FIELD

Embodiments described herein relate generally to a signal monitoring circuit and a signal monitoring method using the same.

BACKGROUND

Recently, the importance of functional safety is increasing. In particular, because automobile-related instruments require to ensure high safety, various regulations are provided for a failure rate, a failure detection rate, and the like, and there is demanded a high failure detection rate with which information on abnormality can be reported immediately when an input signal or a related instrument has any abnormality. On the other hand, when a configuration for failure detection is installed on a large scale, power consumption increases. For this reason, there is desired a signal monitoring circuit that can detect various abnormalities in a simple configuration.

DETAILED DESCRIPTION

In general, according to one embodiment, a signal monitoring circuit includes: a first comparator circuit that compares an input signal with a first reference value to output a first output signal; a second comparator circuit that compares the input signal with a second reference value different from the first reference value to output a second output signal; a delay time detecting circuit that detects a time difference between times at which the first and second output signals are output; and a threshold-value comparator circuit that compares the time difference with a predetermined threshold value to output the comparison result.

Exemplary embodiments of a signal monitoring circuit and a signal monitoring method using the same will be explained below in detail with reference to the accompanying drawings. Moreover, the present invention is not limited to the following embodiments.

First Embodiment

Figure 1:
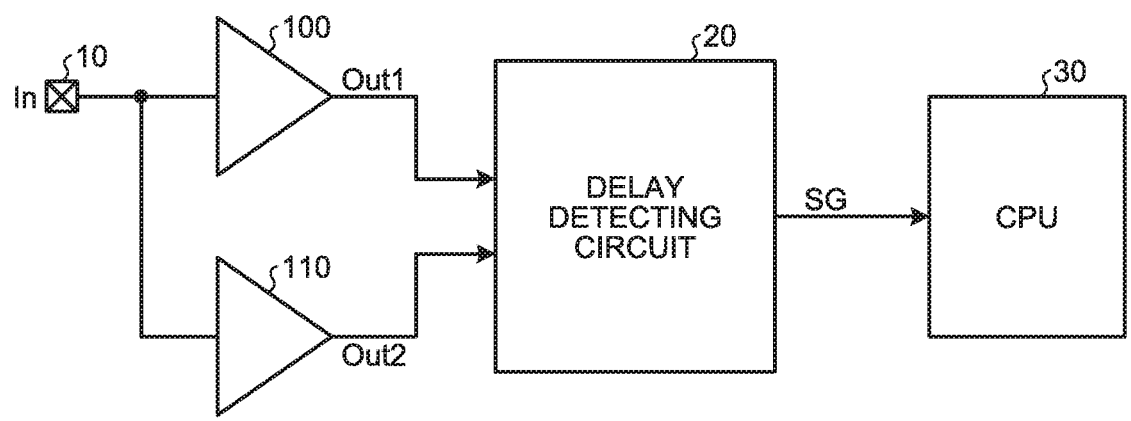
FIG. 1 is a diagram illustrating a configuration of a signal monitoring circuit according to a first embodiment.

FIG. 1 is a diagram illustrating a configuration of a signal monitoring circuit according to the first embodiment. The signal monitoring circuit according to the present embodiment includes an input port 10 to which an input signal In is applied. The input signal In is supplied to first and second comparator circuits 100 and 110.

The first comparator circuit 100 compares the input signal In with a first reference voltage V1 (not illustrated) to output an output signal Out1 indicative of the comparison result. The second comparator circuit 110 compares the input signal In with a second reference voltage V2 (not illustrated) to output an output signal Out2 indicative of the comparison result. The first reference voltage V1 and the second reference voltage V2 are set to different values.

The output signal Out1 and the output signal Out2 are supplied to a delay detecting circuit 20. The delay detecting circuit 20 detects a delay time between the output signal Out1 and the output signal Out2, namely, a time difference between times at which the output signal Out1 and the output signal Out2 are supplied to the delay detecting circuit 20. The delay detecting circuit 20 compares the detected delay time with a predetermined threshold value, and outputs a detection signal SG in accordance with the comparison result. The detection signal SG is supplied to a central processing unit (CPU) 30. For example, when the delay time is longer than the threshold value, the High-level detection signal SG is output and supplied to the CPU 30.

The case where the delay time is longer than the threshold value includes, for example, a case where a slew rate of the input signal In is long. Therefore, for example, a state where the slew rate of the input signal In becomes longer than a request can be detected and reported to the CPU 30.

The case where the delay time becomes longer than the threshold value includes, for example, a case where one of the first comparator circuit 100 and the second comparator circuit 110 does not operate normally. In other words, there can be a case where the output signal (Out1, Out2) from one of the comparator circuits (100, 110) is detected but an output signal from the other comparator circuit is, for example, in a Low-level state because the other comparator circuit does not operate. The delay detecting circuit 20 can compare the delay time with the threshold value to detect the occurrence of abnormality caused by non-operation of one of the first comparator circuit 100 and the second comparator circuit 110, and can inform the CPU 30 of the abnormality.

According to the first embodiment, the signal monitoring circuit has the configuration that the first comparator circuit 100 compares the input signal In with the first reference voltage V1, the second comparator circuit 110 compares the input signal In with the second reference voltage V2, and the delay detecting circuit 20 detects the delay time between the output signals (Out1, Out2) from the respective comparator circuits (100, 110). By comparing the time difference, namely, the delay time, between times at which the first output signal Out1 and the second output signal Out2 are output, with a predetermined threshold value, the signal monitoring circuit can detect the abnormality of the input signal In or the state where one of the first comparator circuit 100 and the second comparator circuit 110 has a trouble.

Figure 2:
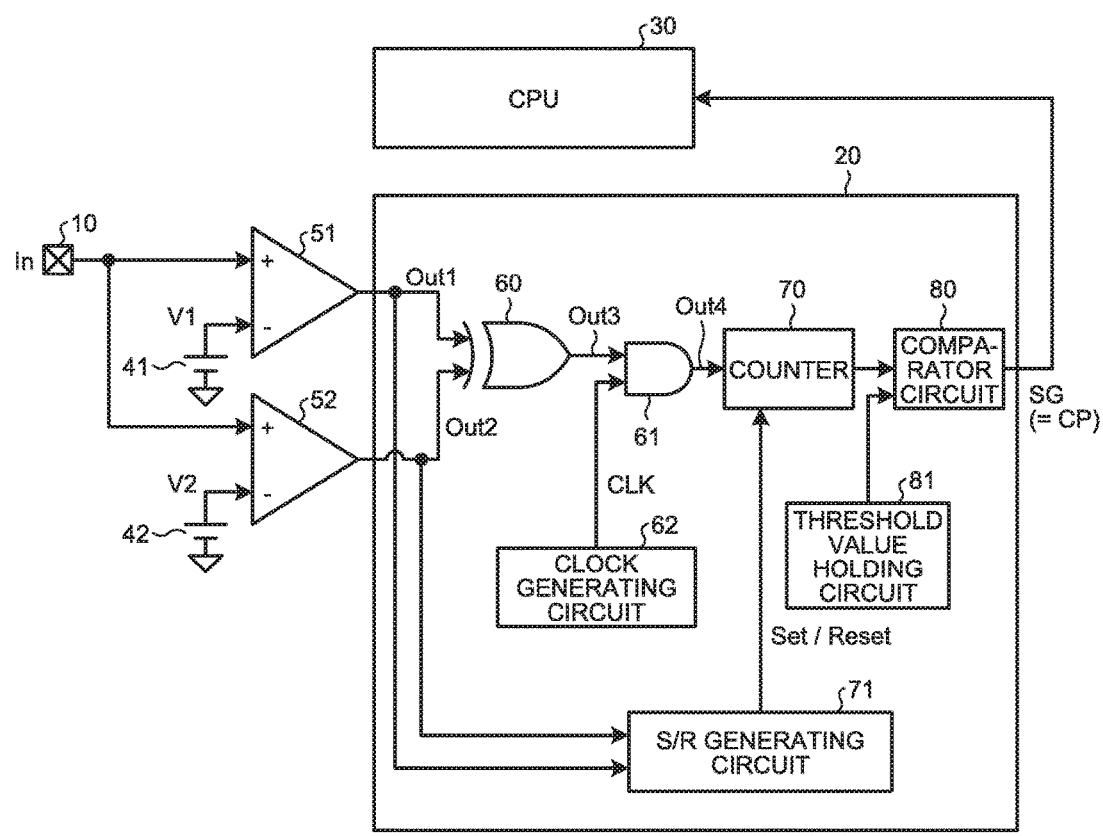
FIG. 2 is a diagram illustrating a specific configuration of the signal monitoring circuit.

FIG. 2 is a diagram illustrating a specific configuration of the signal monitoring circuit according to the first embodiment. The components corresponding to the already-described embodiment have the same reference numbers, and the duplicated description is performed only when required. After that, the above respect is also applied to the explanations of the other embodiments.

The signal monitoring circuit according to the present embodiment includes a first comparator circuit 51 and a second comparator circuit 52. The input signal In is supplied to a positive terminal (+) of the first comparator circuit 51, and a first reference voltage V1 is applied to a negative terminal (−) of the first comparator circuit 51 by a voltage source 41. The first comparator circuit 51 outputs an output signal Out1 corresponding to a comparison result between the input signal In and the first reference voltage V1. The input signal In is supplied to a positive terminal (+) of the second comparator circuit 52, and a second reference voltage V2 is applied to a negative terminal (−) of the second comparator circuit 52 by a voltage source 42. The second comparator circuit 52 outputs an output signal Out2 corresponding to a comparison result between the input signal In and the second reference voltage V2. The output signals Out1 and Out2 are output to the delay detecting circuit 20.

The delay detecting circuit 20 includes an EXOR circuit 60, an AND circuit 61, a clock generating circuit 62, a counter 70, an S/R generating circuit 71, a comparator circuit 80, and a threshold value holding circuit 81. The output signal Out1 and the output signal Out2 are supplied to the EXOR circuit 60. The EXOR circuit 60 outputs to the AND circuit 61 an output signal Out3 that is the result of an exclusive OR of the output signal Out1 and the output signal Out2.

The output signal Out3 and a clock signal CLK from the clock generating circuit 62 are supplied to the AND circuit 61. The clock generating circuit 62 can have a configuration that the clock generating circuit includes, for example, a crystal oscillator (not illustrated) and a frequency divider circuit (not illustrated), and divides a reference-frequency signal oscillated by the crystal oscillator at a predetermined ratio to output the clock signal CLK. The AND circuit 61 outputs to the counter 70 a signal corresponding to the High-level clock signal CLK as an output signal Out4 during a state where the output signal Out3 is a High level.

The S/R generating circuit 71 generates a set signal Set and a reset signal Reset in response to the output signal Out1 and the output signal Out2. For example, the S/R generating circuit 71 can have a configuration that the S/R generating circuit generates the set signal Set and the reset signal Reset in response to times at which the output signal Out1 and the output signal Out2 are respectively shifted to the High level. Moreover, for example, the S/R generating circuit 71 can have a configuration that the S/R generating circuit includes a differentiating circuit (not illustrated) and a waveform circuit (not illustrated). Herein, the waveform circuit shapes the output of the differentiating circuit to output only a positive-side signal. Moreover, the S/R generating circuit 71 can have a configuration that the S/R generating circuit generates the set signal Set in accordance with any signal generated early among signals generated in response to the rising of the output signals Out1 and Out2.

The counter 70 counts the number of the High-level risings of the output signal Out4 between times at which the set signal Set and the reset signal Reset are respectively supplied from the S/R generating circuit 71, for example.

The output signal of the counter 70 is supplied to the comparator circuit 80. The output signal of the counter 70 corresponds to a delay time. The comparator circuit 80 compares the output signal of the counter 70 with a predetermined threshold value held in the threshold value holding circuit 81. The threshold value held in the threshold value holding circuit 81 can be set as a value obtained by dividing the threshold time difference by a period of the clock signal CLK.

The comparator circuit 80 outputs a comparison signal CP corresponding to a comparison result of the output signal of the counter 70 and the threshold value. For example, when the number of counts of the counter 70 exceeds the threshold value, namely, when the delay time between the output signal Out1 and the output signal Out2 is longer than the threshold value, the comparator circuit 80 outputs the High-level comparison signal CP. The comparison signal CP is supplied to the CPU 30 as the detection signal SG of the delay detecting circuit 20. The CPU 30 performs various controls in response to the detection signal SG. For example, the CPU controls to inform a driver of a need to switch a driving mode of an automobile from an automatic driving mode to a driving mode by the driver.

The signal monitoring circuit according to the present embodiment counts the number of the clock signals CLK supplied between times at which the output signals (Out1, Out2) are output to compute the delay time between the output signals from the first comparator circuit 51 and the second comparator circuit 52. Moreover, the time interval in which the clock signal CLK is counted can be associated with the delay time between the output signals because the time interval is specified by the set signal Set and the reset signal Reset that are generated from the respective output signals.

Figure 3:
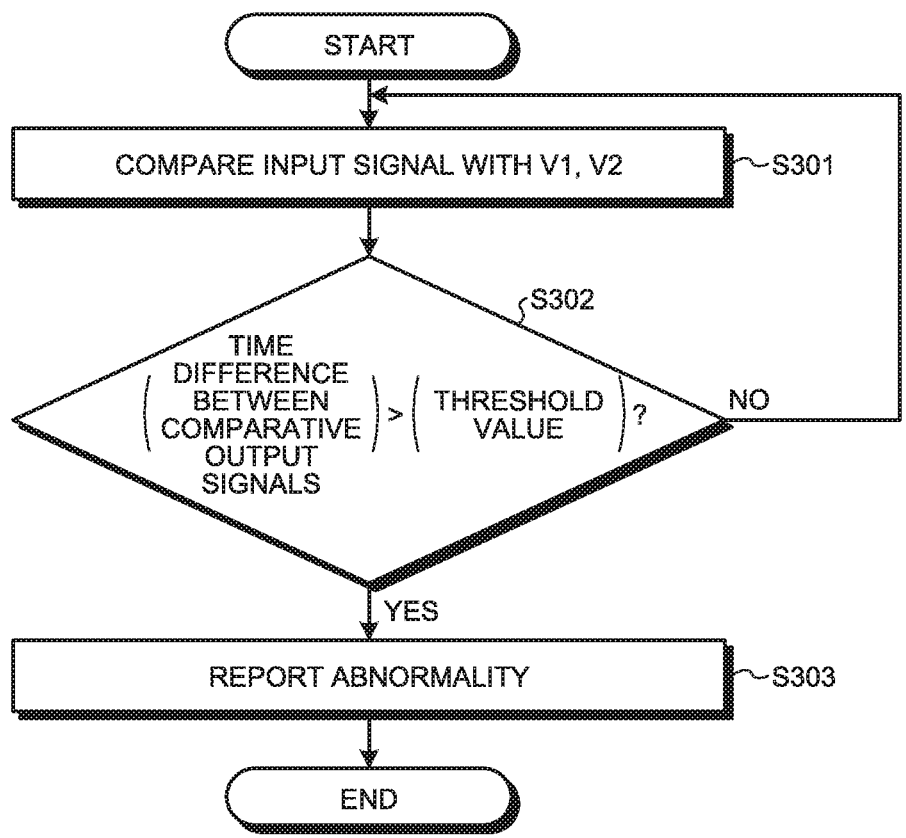
FIG. 3 is a flowchart illustrating a procedure of a signal monitoring method that uses the signal monitoring circuit according to the first embodiment.

FIG. 3 is a flowchart illustrating a procedure of a signal monitoring method that uses the signal monitoring circuit of FIG. 2. The input signal In is compared with the first reference voltage V1 and the second reference voltage V2 (S301). The input signal In and the first reference voltage V1 are compared by the first comparator circuit 51, and the input signal In and the second reference voltage V2 are compared by the second comparator circuit 52.

A time difference between the output signal Out1 that is the comparative output signal of the first comparator circuit 51 and the output signal Out2 that is the comparative output signal of the second comparator circuit 52 is compared with the predetermined threshold value (S302). When the time difference is larger than the threshold value (S302: Yes), the CPU is informed of the abnormality (S303). When the time difference is not larger than the threshold value (S302: No), it is continued to compare the input signal In with the first and second reference voltages V1 and V2.

Figure 4:
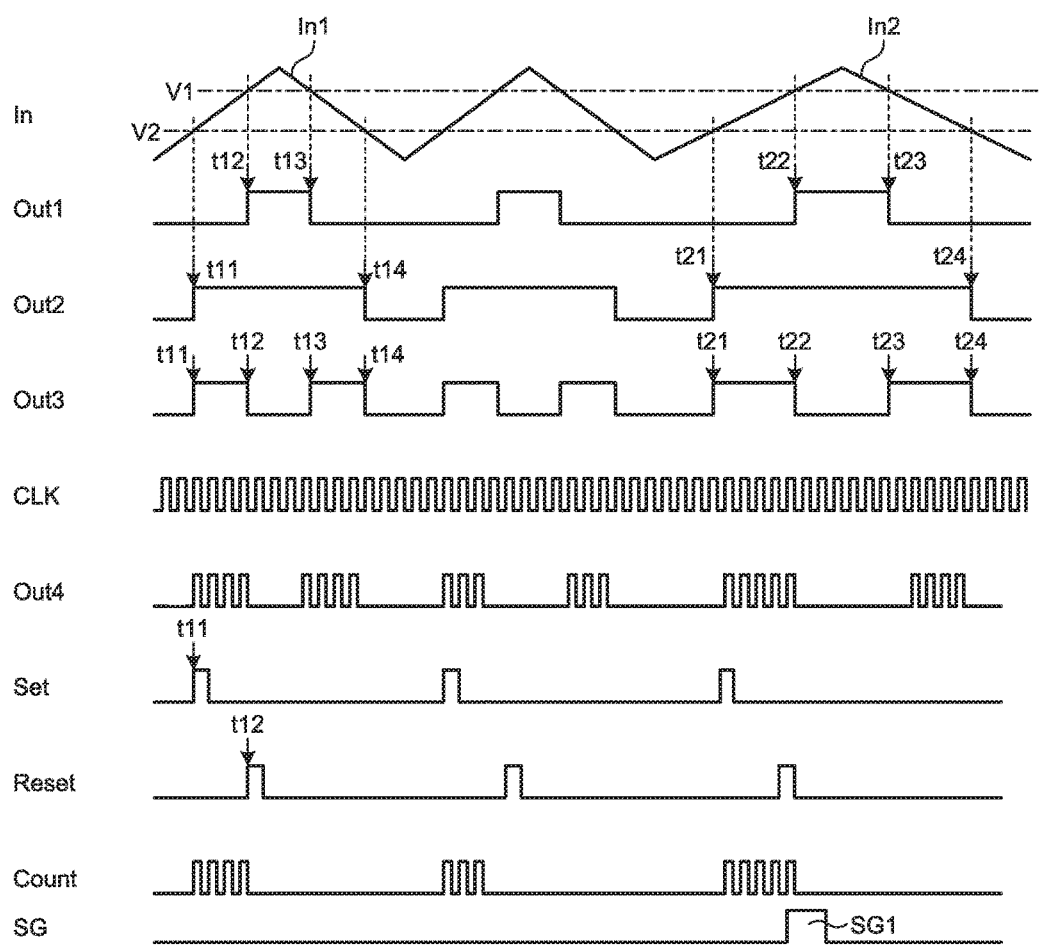
FIG. 4 is a diagram illustrating a timing chart of the signal monitoring method.

FIG. 4 is a diagram illustrating a timing chart in the flow of the signal monitoring method illustrated in FIG. 3. In FIG. 4, the threshold value is set to four. In order to explain the case of monitoring a slew rate of the input signal In, the case where the triangular-wave input signal In is supplied is illustrated for descriptive purposes. The case where the slew rate of the input signal In is monitored includes, for example, a case where the slew rate of the input signal In is defined from the viewpoint of a safety function and a case where an analog signal is input as the input signal In.

The input signal In is compared with the first reference voltage V1 and the second reference voltage V2. The output signal Out1 becomes a High level at a timing t12 at which an input signal In1 becomes larger than the first reference voltage V1, and becomes a Low level at a timing t13 at which the input signal In1 becomes smaller than the first reference voltage V1.

The output signal Out2 becomes a High level at a timing t11 at which the input signal In1 becomes larger than the second reference voltage V2, and becomes a Low level at a timing t14 at which the input signal In1 becomes smaller than the second reference voltage V2.

Similarly, in the case of an input signal In2, the output signal Out1 becomes a High level at a timing t22, and becomes a Low level at a timing t23. The output signal Out2 becomes a High level at a timing t21, and becomes a Low level at a timing t24.

The output signal Out3 becomes a High level when one of the output signal Out1 and the output signal Out2 is a High level. Therefore, the output signal Out3 becomes a High level between the timing t11 and the timing t12 and between the timing t13 and the timing t14 in the case of the input signal In1, and becomes a High level between the timing t21 and the timing t22 and between the timing t23 and the timing t24 in the case of the input signal In2.

The output signal Out4 becomes a High level when both the levels of the output signal Out3 and the clock signal CLK are High. Therefore, the clock signal CLK supplied during the High level of the output signal Out3 is output as the output signal Out4

The set signal Set is output in response to the rising (t11) of the output signal Out2, and the reset signal Reset is output in response to the rising (t12) of the output signal Out1. The counter signal starts the count in response to the rising (t11) of the set signal Set, and terminates the count in response to the rising (t12) of the reset signal Reset.

When the number of counts of the count signal is larger than the threshold value, a detection signal SG is output as a High-level signal, for example. In FIG. 4, a High-level output signal SG1 is output because a delay exceeding the threshold value occurs in the case of the input signal In2.

A time difference between timings, for example, the timing t12 and the timing t11, at which the input signal In exceeds the first reference voltage V1 and the second reference voltage V2, is changed in accordance with the inclination of the input signal In, namely, the slew rate of the input signal In. As the slew rate of the input signal In becomes lower, the time difference between the timings becomes longer. Therefore, the slew rate of the input signal In can be monitored by the time difference between the output timings of the output signals Out1 and Out2. When the slew rate of the input signal In becomes lower and the time difference between the output timings of the output signals Out1 and Out2 exceeds the predetermined threshold time difference, the CPU 30 can be informed of the abnormality of the input signal In.

The counter 70 counts the number of the clock signals CLK detected between the risings of the output signal Out1 and the output signal Out2 to detect the delay time between the output signal Out1 and the output signal Out2. Therefore, the delay time is dependent on the number of the clock signals CLK counted between the output timings of the output signal Out1 and the output signal Out2. Therefore, when the period of the clock signal CLK is shortened, the time difference between the output timings of the output signal Out1 and the output signal Out2 becomes longer apparently, this state corresponds to the lengthening of the delay time. Therefore, for example, when a system clock for driving a system including the CPU 30 is used as the clock signal CLK for measuring the delay time, the abnormality caused by the increase in the frequency of the system clock can be detected.

When the first comparator circuit 51 is inoperative, it is continued to output the High-level output signal Out3 because the reset signal Reset based on the output signal Out1 is not output. For this reason, when the number of counts of the counter 70 increases and thus the number of counts exceeds the threshold value, the comparator circuit 80 outputs the High-level comparison signal CP. As a result, the abnormality caused by the trouble of the comparator circuits (51, 52) can be also detected.

By employing the simple configuration that the input signal In is compared with the two reference voltages (V1, V2) having different values by using the two comparator circuits and the time difference between the output timings of the output signals indicating the comparison result is compared with the predetermined threshold time difference, it is possible to monitor the abnormality of the input signal In, the abnormality of the comparator circuits, and further the abnormality of the system clock.

Second Embodiment

Figure 5:
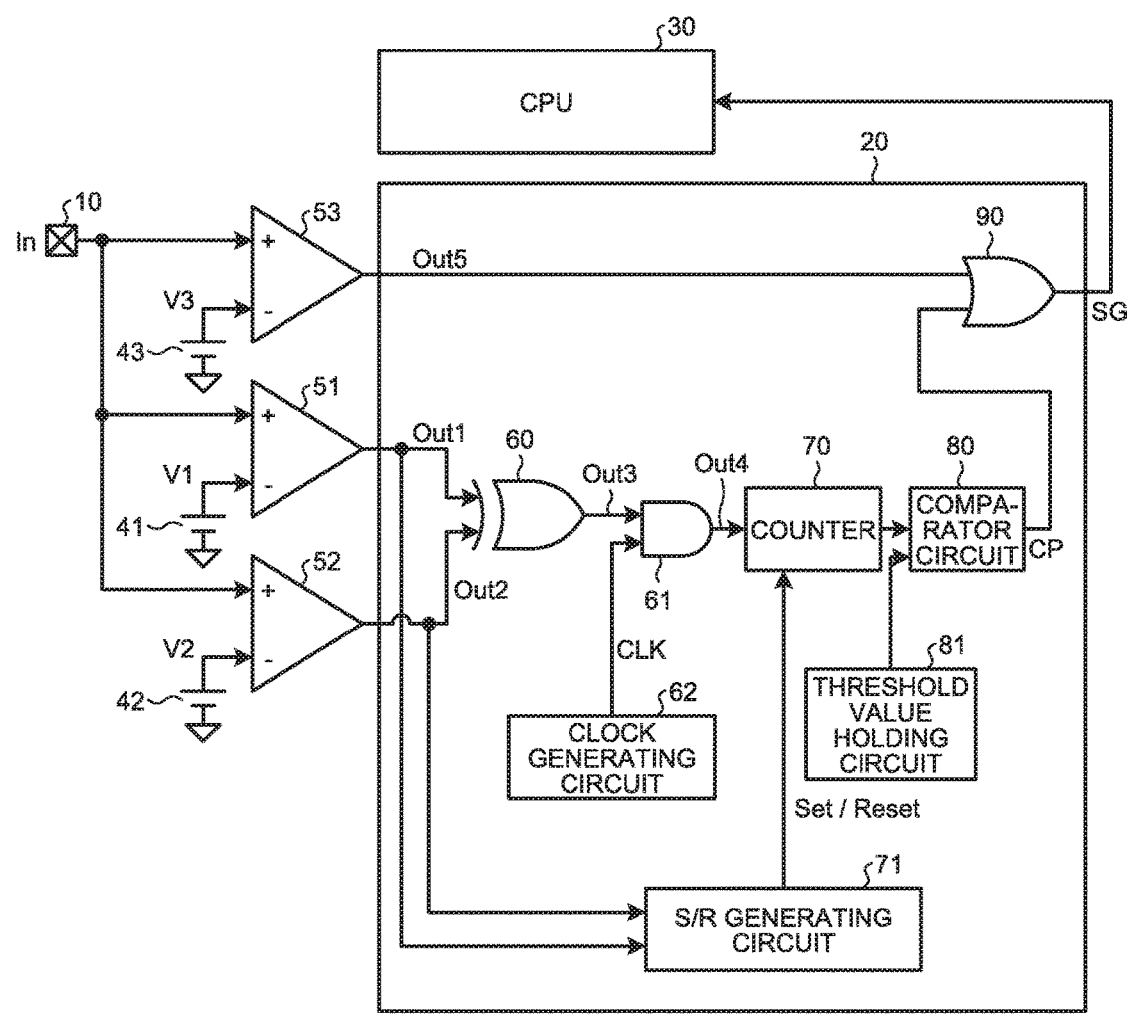
FIG. 5 is a diagram illustrating a configuration of a signal monitoring circuit according to a second embodiment.

FIG. 5 is a diagram illustrating the configuration of a signal monitoring circuit according to the second embodiment. The signal monitoring circuit according to the present embodiment further includes a third comparator circuit 53 and an OR circuit 90. In the signal monitoring circuit according to the present embodiment, the monitoring of the size of the input signal In by the third comparator circuit 53 is simultaneously performed in addition to the monitoring of the delay time of the input signal In by the first and second comparator circuits 51 and 52.

The input signal In is supplied to a positive input terminal (+) of the third comparator circuit 53, and the third reference voltage V3 is applied to a negative input terminal (−) from a voltage source 43. For example, a maximum voltage allowable as the input signal In is set as the third reference voltage V3. The third comparator circuit 53 outputs an output signal Out5 corresponding to the comparison result of the input signal In and the third reference voltage V3.

The OR circuit 90 is included in the delay detecting circuit 20. The detection signal SG is output to the OR circuit 90 based on the output signal Out5 and the comparison signal CP that is the output signal of the comparator circuit 80.

When the slew rate of the input signal In decreases and the time difference, namely the delay time, between the output timings of the output signals Out1 and Out2 becomes larger than the predetermined threshold time difference, the delay detecting circuit 20 informs the CPU of the abnormality by using the comparison signal CP. On the other hand, when the signal level of the input signal In exceeds the third reference voltage V3 set as an input tolerance, the delay detecting circuit 20 informs the CPU of the abnormality by using the output signal Out5.

Figure 6:
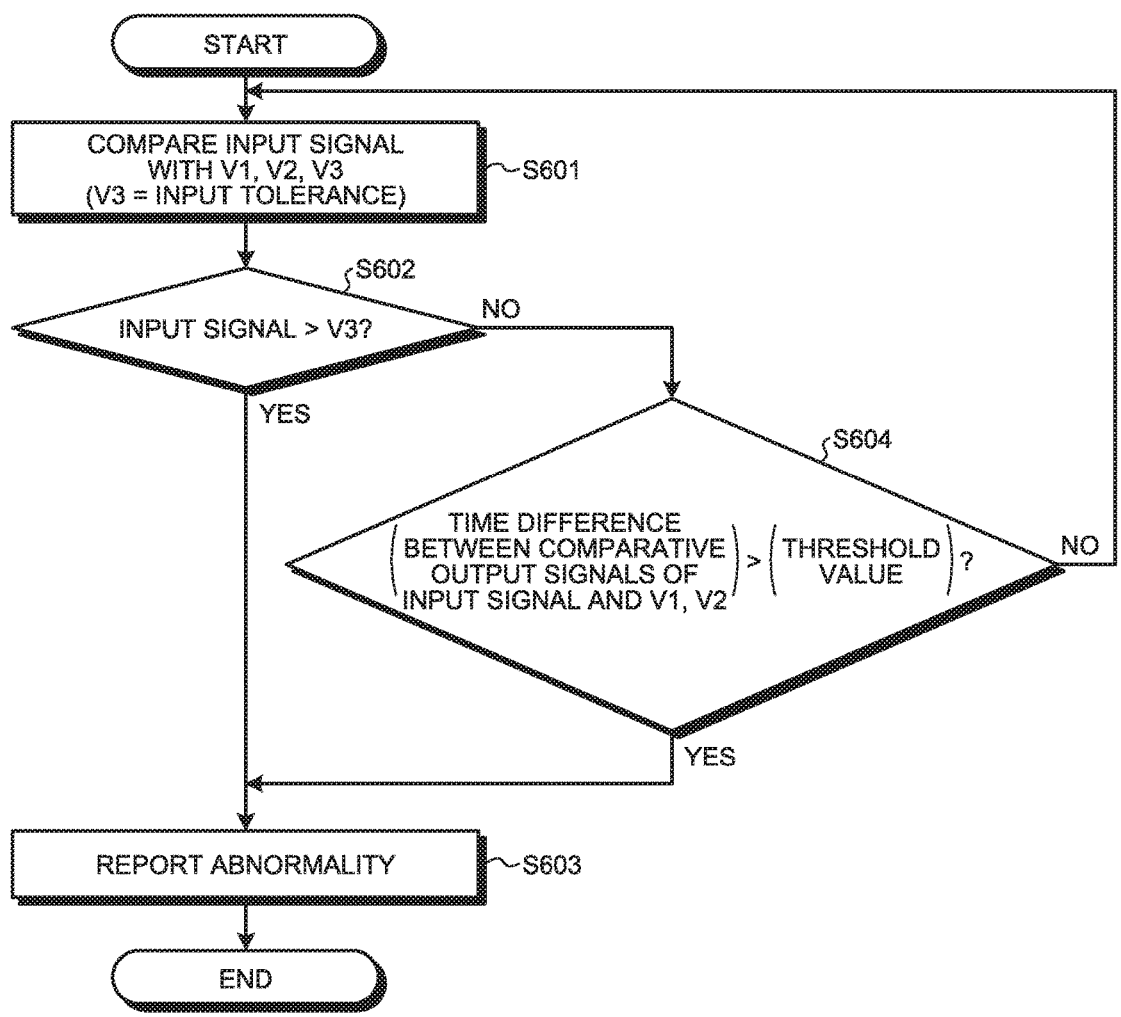
FIG. 6 is a flowchart illustrating a procedure of a signal monitoring method that uses the signal monitoring circuit according to the second embodiment.

FIG. 6 is a flowchart illustrating a procedure of a signal monitoring method that uses the signal monitoring circuit of FIG. 5. The input signal In is compared with the first reference voltage V1, the second reference voltage V2, and the third reference voltage V3 (S601). The third reference voltage V3 is set to a voltage allowable as an input signal.

When the input signal In is larger than the third reference voltage V3 (S602: Yes), the output signal Out5 that reports the abnormality is output from the third comparator circuit 53.

When the input signal In is not more than the third reference voltage V3 (S602: No), the time difference between the output signals output by the comparison result obtained by comparing the input signal In with the first reference voltage V1 and the second reference voltage V2 is compared with the predetermined threshold value (S604). When the time difference between the output signals output by the comparison result is larger than the predetermined threshold value (S604: Yes), a signal that reports the abnormality is output (S603). When the time difference between the output signals is not more than the threshold value (S604: No), it is continued to compare the input signal In with the first reference voltage V1, the second reference voltage V2, and the third reference voltage V3 (S601).

By providing a step of comparing the input signal In with the third reference voltage V3 set as the tolerance of the input signal In, the abnormality caused by supplying the input signal In that exceeds a tolerance can be also detected in addition to the monitoring of an abnormal state described above.

Figure 7:
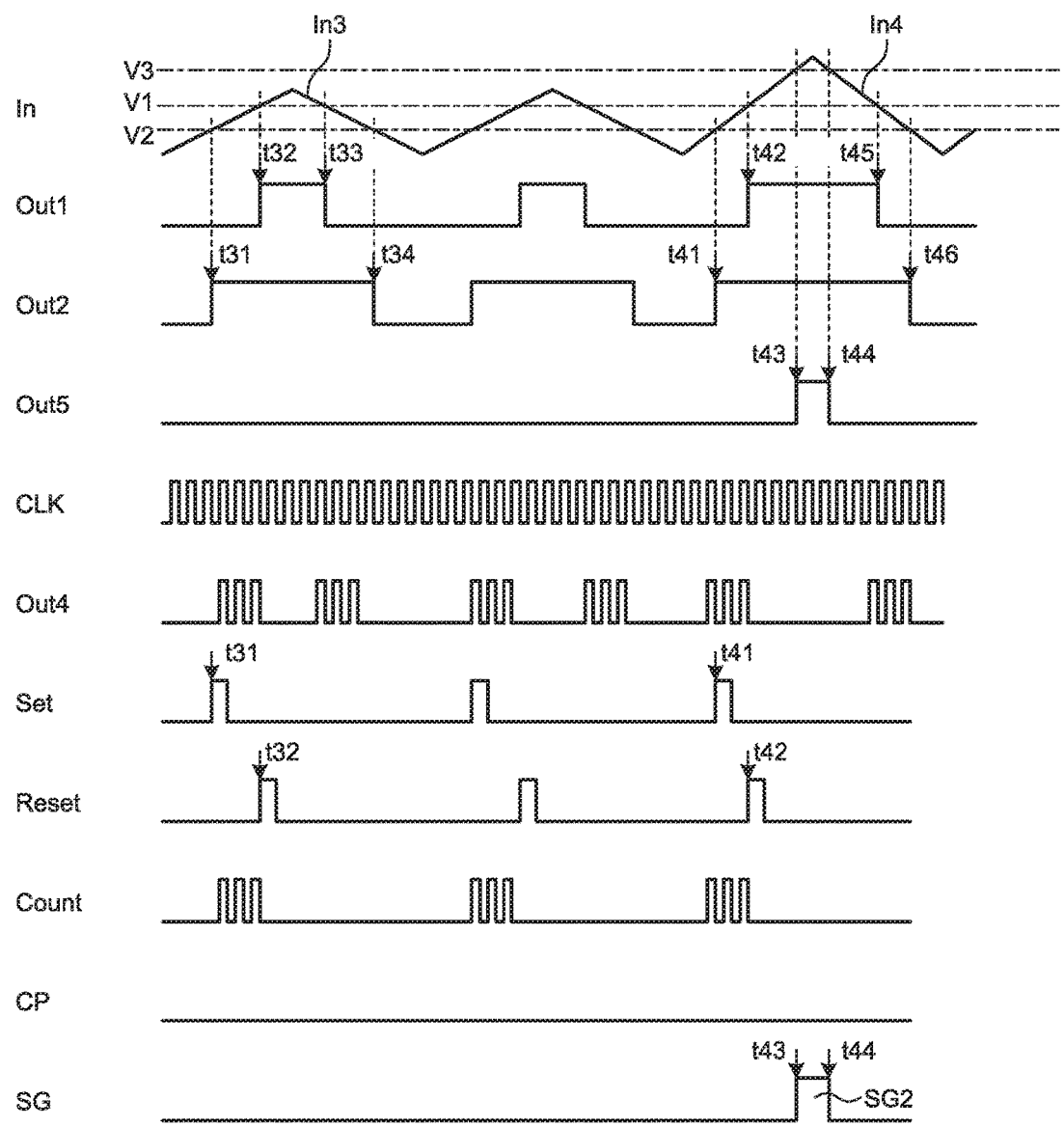
FIG. 7 is a diagram illustrating a timing chart of the signal monitoring method.

FIG. 7 is a diagram illustrating a timing chart in the flow of the signal monitoring method of FIG. 6. Parts different from the timing chart in FIG. 4 will be mainly explained.

The output signal Out1 becomes a High level between timings t32 and t33 between which an input signal In3 is larger than the first reference voltage V1. Similarly, the output signal Out2 becomes a High level between timings t31 and t34 between which the input signal In3 is larger than the second reference voltage V2.

Similarly, in the case of an input signal In4, the output signal Out1 becomes a High level between timings t42 and t45, and the output signal Out2 becomes a High level between timings t41 and t46.

The output signal Out5 that becomes a High level at a timing t43 at which the input signal In4 exceeds the third reference voltage V3, and that becomes a Low level at a timing t44 at which the input signal In4 becomes smaller than the third reference voltage V3. The output signal Out4 becomes a High level when the both levels of the output signal Out3 and the clock signal CLK are High.

The count signal starts the count in response to the rising of the set signal Set, and terminates the count in response to the rising of the reset signal Reset. The comparison signal CP is output based on the comparison result of the number of counts of the count signal and the threshold value. In the example illustrated in FIG. 7, because the number of counts of the count signal does not exceed the threshold value, the High-level comparison signal CP is not output.

The detection signal SG outputs a signal that becomes a High level when the level of the output signal Out5 is High. In FIG. 7, it is detected that the input signal In4 exceeds the reference voltage V3 in the case of the input signal In4 (between t43 and t44), and the detection signal SG2 that indicates abnormality is output.

By providing the configuration that the input signal In is compared with the tolerance (V3) the input signal In, in addition to the configuration that the input signal In is compared with the two reference voltages (V1, V2) and the time difference of the output signals indicating the comparison result is compared with the predetermined threshold value, it is possible to monitor the abnormality caused by the degradation of the slew rate of the input signal In, the abnormality of the comparator circuit itself, the abnormality of the system clock, and further the abnormal state in which the input signal In exceeding the tolerance is supplied.

Third Embodiment

Figure 8:
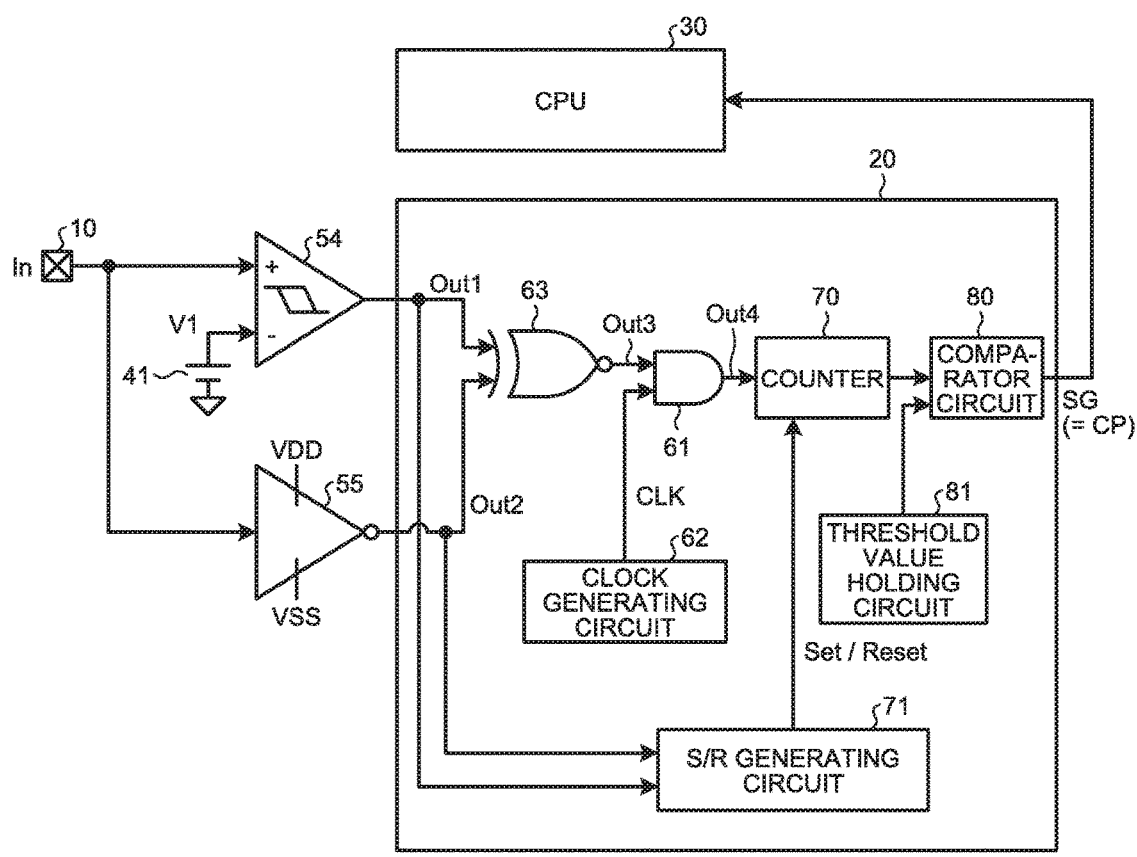
FIG. 8 is a diagram illustrating a configuration of a signal monitoring circuit according to a third embodiment.

FIG. 8 is a diagram illustrating the configuration of a signal monitoring circuit according to the third embodiment. The signal monitoring circuit according to the present embodiment includes a first comparator circuit 54 and an inverter 55 in place of the first and second comparator circuits 51 and 52 according to the first embodiment. The first comparator circuit 54 has hysteresis characteristics.

The first comparator circuit 54 outputs the output signal Out1 corresponding to a comparison result of the input signal In and the first reference voltage V1. The inverter 55 is operated by, for example, a power supply voltage VDD and ground potential VSS to output the output signal Out2. For example, when the inverter 55 is configured with a CMOS inverter, the circuit threshold value of the inverter 55 becomes VDD/2. In other words, the inverter 55 operates as a second comparator circuit that compares the input signal In with VDD/2.

The delay detecting circuit 20 includes an EXNOR circuit 63 instead of the EXOR circuit 60 according to the first embodiment. The EXNOR circuit 63 outputs an output signal Out3 that is an inversion signal of an exclusive OR of the output signal Out1 of the first comparator circuit 54 and the output signal Out2 of the inverter 55. Therefore, the output signal Out3 becomes a High level when both the levels of the output signal Out1 and the output signal Out2 are Low. Therefore, the output signal Out3 indicates a time interval corresponding to a time difference between times at which the output signal Out1 and the output signal Out2 are supplied. The output signal Out3 and the clock signal CLK are supplied to the AND circuit 61. After that, the count of the clock signal CLK is performed by the counter 70, the comparison of the count result and the threshold value is performed, and a detection signal SG corresponding to the comparison result is supplied to the CPU 30.

In the present embodiment, the inverter 55 is used as the second comparator circuit. Because the circuit threshold value of the inverter 55 acts as the second reference voltage V2, it is not necessary to provide a separate circuit configuration for setting the second reference voltage V2. Moreover, because the comparator circuit 54 having hysteresis characteristics is used, it is possible to output the output signal Out1 stable with respect to the variation of the input signal In.

Figure 9:
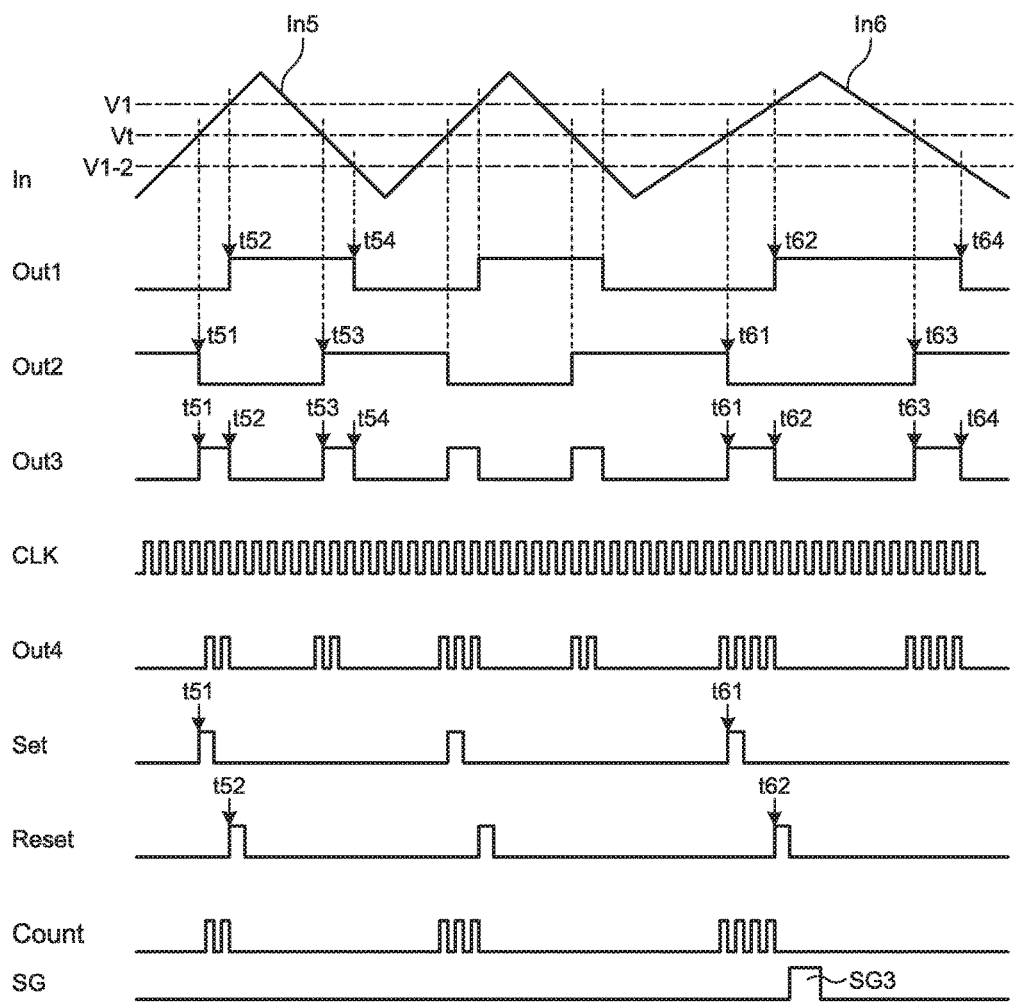
FIG. 9 is a diagram illustrating a timing chart of a signal monitoring method that uses the signal monitoring circuit according to the third embodiment.

FIG. 9 is a diagram illustrating a timing chart of a signal monitoring method that uses the signal monitoring circuit of FIG. 8. An input signal In5 is compared with the first reference voltage V1. The output signal Out1 becomes a High level at a timing t52 at which the input signal In5 becomes larger than the first reference voltage V1, and becomes a Low level at a timing t54 at which the input signal In5 becomes smaller than a reference voltage V1-2. The reference voltage V1-2 is a reference voltage that is changed by the hysteresis characteristics of the first comparator circuit 54.

The output signal Out2 becomes a Low level at a timing t51 at which the input signal In5 becomes larger than a circuit threshold value Vt of the inverter 55, and becomes a High level at a timing t53 at which the input signal In5 becomes smaller than the circuit threshold value Vt.

Similarly, in the case of an input signal In6, the output signal Out1 becomes a High level at a timing t62, and becomes a Low level at a timing t64. The output signal Out2 becomes a Low level at a timing t61, and becomes a High level at a timing t63.

The output signal Out3 becomes a High level when both the levels of the output signal Out1 and the output signal Out2 are Low. Therefore, the output signal Out3 becomes a High level between the timing t51 and the timing t52 and between the timing t53 and the timing t54 in the case of the input signal In5, and becomes a High level between the timing t61 and the timing t62 and between the timing t63 and the timing t64 in the case of the input signal In6.

The output signal Out4 becomes a High level when both the levels of the output signal Out3 and the clock signal CLK are High. The set signal Set is output in response to the fallings (t51, t61) of the output signal Out2, and the reset signal Reset is output in response to the risings (t52, t62) of the output signal Out1. In FIG. 9, because a delay exceeding the threshold value occurs in the case of the input signal In6, a High-level detection signal SG3 is output.

By employing the configuration that a time difference between the output signals (Out1, Out2) of the comparator circuit 54 and the inverter 55 is compared with a threshold value, it is possible to monitor the abnormality of the input signal In, the abnormality of the comparator circuit 54 or the inverter 55, and further the abnormality of a system clock. Moreover, by using the comparator circuit 54 having hysteresis characteristics, it is possible to obtain the output signal Out1 stable with respect to the variation of the input signal In caused by noises, for example. Moreover, because the circuit threshold value Vt of the inverter 55 can be used as a reference voltage in a comparison operation with the input signal In, it is not necessary to provide a separate circuit configuration for setting a reference voltage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A signal monitoring circuit comprising:
   a first comparator circuit that compares an input signal with a first reference value to output a first output signal;
   a second comparator circuit that compares the input signal with a second reference value different from the first reference value to output a second output signal;
   a delay time detecting circuit that detects a time difference between times at which the first and second output signals are output; and
   a threshold-value comparator circuit that compares the time difference with a predetermined threshold value to output a comparison result, wherein
   the delay time detecting circuit includes:
      an EXOR circuit to which the first and second output signals are supplied;
      an AND circuit to which an output signal of the EXOR circuit and a predetermined clock signal are supplied; and
      a counter that counts a clock output signal output from the AND circuit.

2. The signal monitoring circuit according to claim 1, wherein the predetermined clock signal includes a system clock signal.

3. The signal monitoring circuit according to claim 1, wherein one of the first and second comparator circuits includes an inverter circuit.

4. The signal monitoring circuit according to claim 1, wherein one of the first and second comparator circuits has hysteresis characteristics.

5. The signal monitoring circuit according to claim 1, further comprising a third comparator circuit that compares the input signal with a third reference value to output the comparison result, wherein
   the third reference value is set to a value of an allowable voltage of the input signal.

6. The signal monitoring circuit according to claim 5, further comprising an OR circuit to which an output signal of the third comparator circuit and an output of the threshold-value comparator circuit are supplied.

7. The signal monitoring circuit according to claim 1, further comprising a threshold value holding circuit that holds the threshold value, wherein
   the threshold value holding circuit holds a threshold number of counts obtained by dividing a threshold time by a period of the clock signal.

8. The signal monitoring circuit according to claim 1, further comprising a signal generating circuit that generates a set signal and a reset signal for controlling an operation of the counter in response to the first and second output signals.

9. The signal monitoring circuit according to claim 1, further comprising a CPU to which the output of the threshold-value comparator circuit is supplied.

10. A signal monitoring method comprising:
    comparing an input signal with a first reference value to output a first output signal at a first timing at which the input signal exceeds the first reference value;
    comparing the input signal with a second reference value different from the first reference value to output a second output signal at a second timing at which the input signal exceeds the second reference value;
    generating clock signals having a predetermined period;
    detecting a time difference between the first timing and the second timing, wherein the detecting the time difference includes counting a number of the clock signals generated in the time difference between the first timing and the second timing;
    holding a value obtained by dividing a threshold time difference by the period of the clock signals as a threshold number of counts;
    comparing the time difference with a predetermined threshold value, wherein the comparing the time difference with the threshold value includes comparing the counted number of clock signals with the threshold number of counts; and
    outputting an abnormal signal when the counted number of clock signals is larger than the threshold number of counts.

11. The signal monitoring method according to claim 10, wherein the detecting the time difference between the first timing and the second timing includes outputting a signal of an exclusive OR of the first and second output signals.

12. The signal monitoring method according to claim 10, wherein
    the outputting the first output signal includes outputting a High-level signal when the input signal exceeds the first reference value,
    the outputting the second output signal includes outputting a Low-level signal when the input signal exceeds the second reference value, and
    the detecting the time difference between the first timing and the second timing includes outputting an inversion signal of an exclusive OR of the first and second output signals.

13. The signal monitoring method according to claim 10, wherein the clock signals include a system clock.

14. The signal monitoring method according to claim 10, wherein the counting the number of the clock signals includes controlling the count of the clock signals at the first timing and the second timing.

15. The signal monitoring method according to claim 10, further comprising:
   setting a third reference value higher than the first and second reference values; and
   comparing the input signal with the third reference value to output a third output signal at a third timing at which the input signal exceeds the third reference value.

16. The signal monitoring method according to claim 15, further comprising outputting a signal obtained by a logical OR of the abnormal signal and the third output signal.

17. The signal monitoring method according to claim 15, wherein the third reference value is set to a tolerance of the input signal.

18. A signal monitoring circuit comprising:
   a first comparator circuit that compares an input signal with a first reference value to output a first output signal, wherein the first comparator circuit has hysteresis characteristics;
   a second comparator circuit that compares the input signal with a second reference value different from the first reference value to output a second output signal, wherein the second comparator circuit includes an inverter circuit;
   a delay time detecting circuit that detects a time difference between times at which the first and second output signals are output, wherein the delay time detecting circuit includes an EXNOR circuit to which the first and second output signals are supplied; and
   a threshold-value comparator circuit that compares the time difference with a predetermined threshold value to output a comparison result.

* * * * *